United States Patent [19]

King

[11] Patent Number: 4,843,625

[45] Date of Patent: Jun. 27, 1989

[54] SOUND REPRODUCTION SYSTEMS

[76] Inventor: Brian M. King, Bay Lodge, Hampton Court, Surrey, United Kingdom, KT8 9DA

[21] Appl. No.: 130,456

[22] PCT Filed: Mar. 18, 1987

[86] PCT No.: PCT/GB87/00191

§ 371 Date: Nov. 16, 1987

§ 102(e) Date: Nov. 16, 1987

[87] PCT Pub. No.: WO87/05774

PCT Pub. Date: Sep. 24, 1987

[30] Foreign Application Priority Data

Mar. 18, 1986 [GB] United Kingdom ............... 86 06646

[51] Int. Cl.[4] ............................................ H03G 5/00

[52] U.S. Cl. ............................................ 381/98

[58] Field of Search ............................ 381/98, 99, 100

[56] References Cited

U.S. PATENT DOCUMENTS

| | | | |
|---|---|---|---|
| 4,198,540 | 4/1980 | Cizek . | |
| 4,237,340 | 12/1980 | Klipsch | 381/99 |
| 4,593,405 | 6/1986 | Frye et al. | 381/99 |
| 4,597,100 | 6/1986 | Grodinsky et al. | 381/99 |
| 4,606,071 | 8/1986 | White, Jr. | 381/99 |

FOREIGN PATENT DOCUMENTS

| | | |
|---|---|---|
| 2451475 | 5/1976 | Fed. Rep. of Germany . |
| 2303435 | 10/1976 | France . |
| 56-48797 | 5/1981 | Japan . |
| 1526344 | 9/1978 | United Kingdom . |
| 2163621 | 2/1986 | United Kingdom . |

OTHER PUBLICATIONS

International Search Report dated Jun. 15, 1987, from the European Patent Office.

*Primary Examiner*—Forester W. Isen
*Attorney, Agent, or Firm*—Flynn, Thiel, Boutell & Tanis

[57] ABSTRACT

A stereophonic sound reproduction system comprises an amplifier (11) having two channels (A, B) connected by wires (17,18) to twin loudspeaker assemblies (12A, 12B). To enhance the sound a bypass (19) is connected across one only (A) of the two channels. The bypass (19) consists of a capacitor $C_1$ of 1.1 Microfarads, a wire-wound resistor R of 2,200 ohms and an inductance (which may be formed at least partially by the inductance of the wire-wound resistance R) of about 2.2 Microhenries. When reproducing digitally-processed sound, the bypass is augmented by a capacitor $C_2$ of 0.22 Microfarads in series with an inductance of 3 Microhenries.

9 Claims, 2 Drawing Sheets

SOUND REPRODUCTION SYSTEMS

Figure 1:
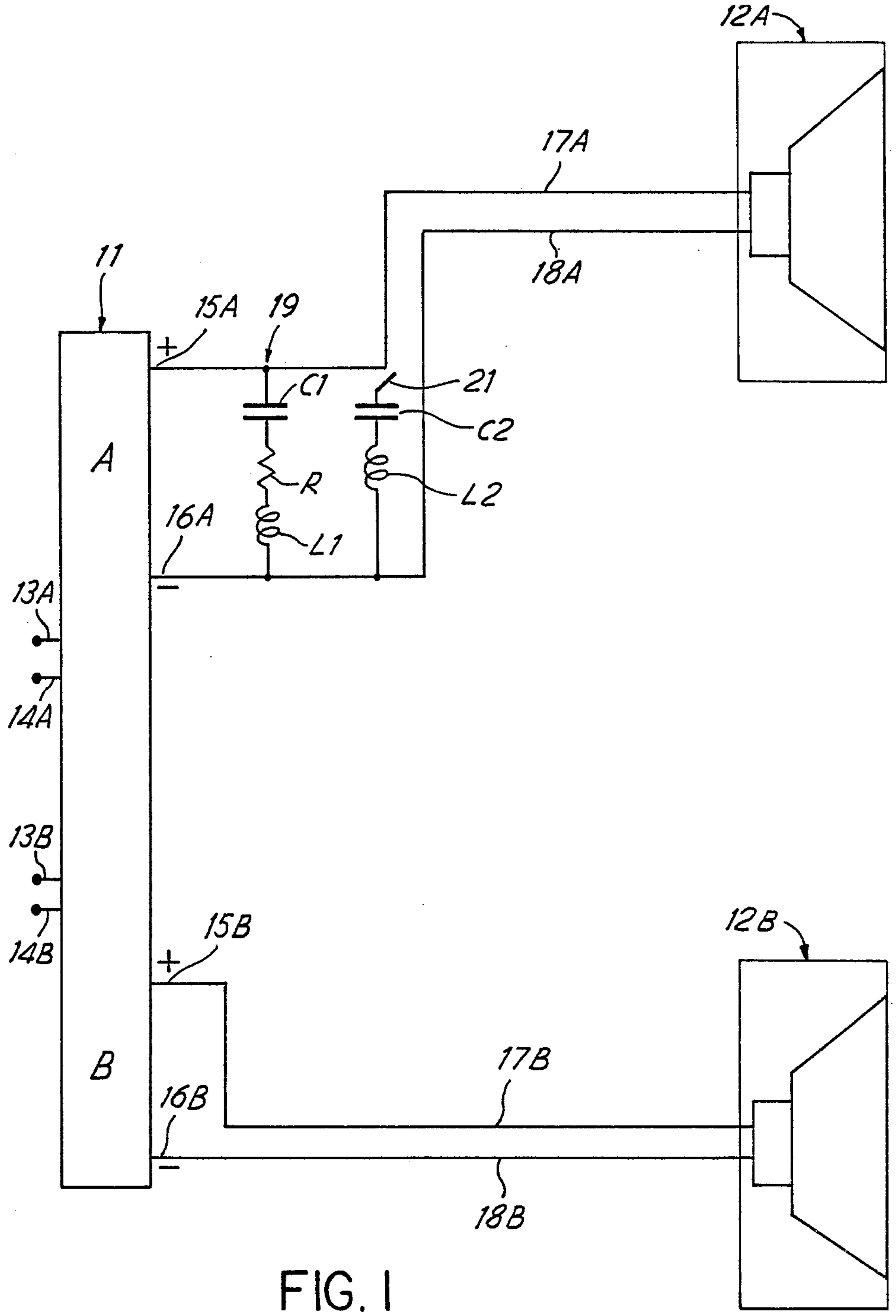

This invention relates to sound reproducing systems and, more particularly, to a bypass for a loudspeaker.

According to the invention, there is provided a sound reproducing system comprising an amplifier and a loudspeaker unit and a bypass modifying the signal passed from the amplifier to the loudspeaker unit. The bypass is a circuit or circuits consisting of resistance, capacitance and inductance. The essential unit of resistance is within about 5% of 6600 ohms and this may be divided by $N_1$, an integer of, say 1 to 12. The essential unit of capacitance is within about 5% of 0.152 Microfarad and this may be multiplied by $N_2$, an integer of 1 to, say, 8, though one-half units or one-third units are sometimes needed. The essential unit of inductance is within about 5% of 24 Microhenrys and this may be divided by $N_3$, an integer of, say, 1 to 15. The capacitance may be used in series with resistance and inductance or in parallel with resistance, in which case both capacitance and resistance should be in series with inductance (or the inherent inductance of wire-wound resistors should be present).

The invention also provides a bypass as defined in the preceding paragraph.

Advantageously the amplifier is a multi-channel amplifier having a multi-channel output and a loudspeaker unit for each channel and the said sound modifying bypasses are provided in parallel with the loudspeaker units.

In carrying out the invention, capacitors complying with British Standard BS 9000 and resistors complying with the BS CECC 40 201-002 are preferably used. Avoidance of the introduction of unacceptable levels of harmonic distortion has been found possible only by using high quality wire-wound resistors. Such resistors may be obtained from Welwyn Wirewound Resistors Limited of Bedlington, Northumbria, England. For similar reasons polystrene capacitors are preferably used. Other types of capacitors and resistors may alternatively be used but provide an inferior substitute, albeit one which may be acceptable on some sound-reproducing systems.

Component nominal values for optimum results will depend on the source of the components used. Fine-tuning can be carried out by adding small-value capacitors and resistors, of the same type as the main components, in parallel and/or series.

The total circuit or circuits may be used entirely on one of a pair of channels A and B or divided into separate unequal circuits for the two channels. Circuits may be used in parallel with each other, either consisting of the same numbers of units of resistance, capacitance and inductance or of different numbers. There are many useful ways of combining the units, some more satifactory than others in achieving a linear spectrum of sound and the closest approach to a three-dimensional effect. The preferred design is a circuit only on channel A where $N_1$ is 3 and the number of units of capacitance, $N_2$, is 7, though the numbers and proportions between the channels may be varied, albeit with somewhat inferior results. For the inductance $N_3$ equals 11. This is the resultant of separate inductances. In some variations of the design, $N_2$ may be an integer plus $\frac{1}{2}$, and for digitally-processed sound, in all cases an extra $1\frac{1}{2}$ units of capacitance should be added, with an inductance of 3 Microhenries in series, to compensate for the difference in high frequencies. For a single loudspeaker system, the circuit may be used on the one speaker. In some variations of the design, several similar circuits may be used in parallel on one channel or unequally on both channels.

I have found that the use of a bypass comprising one or more resistors and capacitors of particular values with inductance as described can modify the sound emitted by a loudspeaker unit in a beneficial manner. The power is distributed more evenly over the spectrum than it is in the absence of the bypass. The bass and treble range and power is increased (and the middle ranges controlled) the dynamic range is increased.

I have determined that the bypasses in accordance with the invention gives rise to this beneficial effect on the sound reproduction, whether the loudspeaker unit they are bypassing is of 4, 8 or 15 ohm impedance, whether moving coil or electrostatic. I have further determined that particularly well-balanced, 'natural' and threedimensionally focussed sound is produced when different conditions prevail on two channels. A primary benefit resulting from the inequality on different channels is that the perspective and realism of the sound is improved. The normal stereo arc is much greater and the perception of a 'stereo seat' (i.e. a single optimum position for a listener) tends to disappear; what is heard is less dependent on the listener's position in a room than is the case without the inequality.

Since no directional information is contained in very high and low frequencies, an increase in frequency range in one loudspeaker only does not affect stereo information from a pair of loudspeakers. It has been found that providing the full frequency range for one loudspeaker is sufficient to give the full frequency range in the sound from a pair of loudspeakers whether they are providing stereophonic or double monophonic sound. When the loudspeakers are unequally extended in frequency range, interference and cancellation are reduced in the extra high frequencies.

Figure 2:
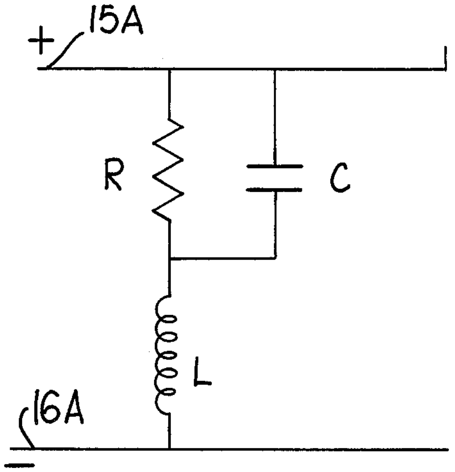

An embodiment of the invention will now be described by way of example with reference to the accompanying drawing, in which FIG. 1 is diagrammatically a two-channel stereophonic amplifier connected to two loudspeakers, and FIG. 2 illustrates an alternate configuration.

FIG. 1 of the drawing shows stereophonic soundreproducing apparatus comprising a two-channel stereophonic amplifier 11 and two loudspeaker assemblies 12A and 12B. The amplifier 11 has two pairs of input terminals 13A, 14A and 13B, 14B, one pair for each channel A, B, and corresponding output terminals 15A, 16A and 15B, 16B for each channel. The output terminals 15 and 16 of each channel are connected by respective wires 17 and 18 to the respective loudspeaker assemblies 12 which may be of the usual type having an enclosure in which are mounted a plurality of loudspeaker units for different parts of the frequency range with appropriate cross over untis.

Connected across one only of the amplifier output channels, in this case channel A, is a bypass unit 19 consisting of a capacitor $C_1$ of 1.1±5% Microfarads, a resistor R of 2,200 ohms ±5% formed by one or more wire-wound resistors and an inductance $L_1$ of 2.2 Microhenrys ±0.5%. Part or all of the inductance may in fact be formed by the inductance of the resistor or resistors forming the resistance R.

Where the equipment is required to reproduce digitally processed sound signals, the bypass 19 is preferably augmented by a further capacitance $C_2$ of 0.22 Microfarad ±5% in series with an inductance $L_2$ of 3 Microhenrys ±0.5%. This additional bypass may be connected in by means of a screw-type terminal at 21 when required (or by means of a suitable switch provided that the latter does not affect the sound).

An alternative configuration of the bypass circuit, which is discussed above, is shown in FIG. 2. This configuration corresponds to FIG. 1 except that the capacitance C1 and resistance R are in parallel relationship.

I claim:

1. A bypass connected to at least one of a loudspeaker and an amplifier output, said bypass comprising: a circuit having a resistance, a capacitance and an inductance, said inductance being in series with each of said resistance and said capacitance, said resistance being within about 5% of 6600 ohms divided by $N_1$, where $N_1$ is an integer of from 1 to 12, said capacitance being within about 5% of 0.152 Microfarad multiplied by $N_2$, where $N_2$ is either an integer of from 1 to 8 or such an integer increased by one half or one third, and said inductance being within about 5% of 24 Microhenrys divided by $N_3$, where $N_3$ is an integer of from 1 to 15.

2. A loudspeaker bypass according to claim 1, wherein the capacitance, the resistance and the inductance are all in series with one another.

3. A loudspeaker bypass according to claim 1, wherein the capacitance is in parallel with the resistance and both the capacitance and the resistance are in series with the inductance.

4. A loudspeaker bypass according to claim 1 wherein the resistance is formed by at least one wire-wound resistor and the wire-wound resistor provides at least some of the inductance.

5. A loudspeaker bypass according to claim 1 for analogue-recorded signals wherein the capacitor is of 1.1±5% Microfarads, in series with the resistance of 2,200 ohms ±5%, the inductance being 2.2 Microhenrys ±5%.

6. A loudspeaker bypass according to claim 1 for digitally processed signals including a further capacitance of 0.22 μF±5% in series with a further inductance of about 3 Microhenrys, the chain formed by the further capacitance and inductance being in parallel with the first-mentioned capacitance, resistance and inductance.

7. Sound reproducing apparatus comprising an audio amplifier having two channels, two loudspeaker assemblies connected to the respective outputs of the channels and one bypass according to claim 1 connected across one of the two outputs.

8. A loudspeaker according to claim 2 wherein the resistance is formed by at least one wire-wound resistor, and said wire-wound resistor provides at least some of the inductance.

9. A loudspeaker according to claim 3 wherein the resistance is formed by at least one wire-wound resistor, and said wire-wound resistor provides at least some of the inductance.

* * * * *